United States Patent [19]

Snyder et al.

[11] Patent Number: 5,120,703
[45] Date of Patent: Jun. 9, 1992

[54] PROCESS FOR PREPARING OXIDE SUPERCONDUCTING FILMS BY RADIO-FREQUENCY GENERATED AEROSOL-PLASMA DEPOSITION IN ATMOSPHERE

[75] Inventors: Robert L. Snyder; Xingwu Wang; Honghai Zhong, all of Alfred, N.Y.

[73] Assignee: Alfred University, Alfred, N.Y.

[21] Appl. No.: 510,011

[22] Filed: Apr. 17, 1990

[51] Int. Cl.$^5$ .......................... B05D 5/12; B05D 3/06
[52] U.S. Cl. ....................................... 505/1; 505/737; 505/730; 427/62; 427/38; 427/39; 427/226; 427/314; 427/126.3; 427/421; 427/57
[58] Field of Search ...................... 427/38, 39, 62, 63, 427/314, 226, 126.3, 421, 57; 505/1, 730, 737

[56] References Cited

U.S. PATENT DOCUMENTS 4,717,584  1/1988  Aoki et al. .............................. 427/38
5,032,568  7/1991  Lau et al. ................................ 505/1

FOREIGN PATENT DOCUMENTS 1-027132  1/1989  Japan .

OTHER PUBLICATIONS

Terashima et al "Preparation of superconducting Y-Ba-Cu-O films by a reactive plasma evaporation method," Appl. Phys. Lett. 52(15) Apr. 1988 pp. 1274-1276.
Kirkland et al., *Advanced Ceramic Materials*, vol. 2, No. 3B (Special Issue), Jul. 1987, pp. 401-410.
Koukitu et al., *Jap. J. of Appl. Phys. Lett.*, vol. 28, No. 7, Jul. 1989, pp. L1212-L1213.
Elam et al, *Advanced Ceramic Materials*, vol. 2, No. 3B (special Issue), Jul. 1987, pp. 411-421.
Bunshah et al, *Deposition Technologies for Films and Coatings*, (Noyes Pub., Park Ridge, N.J.) ©1982, p. 365.

Primary Examiner—Michael Lusignan
Assistant Examiner—Roy V. King
Attorney, Agent, or Firm—Howard J. Greenwald

[57] ABSTRACT

A process for coating a superconductive film onto a substrate is provided. In the first step of this process, a solution of the reagents required to produce the superconductive material is subjected to ultrasonic sound waves to create an aerosol. Thereafter, the aerosol contacted with plasma while being subjected to substantially atmospheric pressure and a radio frequency alternating current in excess of 100 kilohertz; a vapor is produced in this step. The vapor so produced is passed through an orifice and allowed to deposit onto a substrate.

16 Claims, 1 Drawing Sheet

PROCESS FOR PREPARING OXIDE SUPERCONDUCTING FILMS BY RADIO-FREQUENCY GENERATED AEROSOL-PLASMA DEPOSITION IN ATMOSPHERE

FIELD OF THE INVENTION

A process for preparing films of superconducting material by deposition of a plasma vapor upon a substrate. In this process, which is operated under atmospheric pressure, radio frequency energy is used to vaporize a mist containing the reactants which form the superconductive material.

BACKGROUND OF THE INVENTION

Films of superconducting material, with thicknesses of from about 0.1 to about 500 microns, have been proposed for use in electronic circuits and superconducting devices. See, for example, an article by Peter E. Norris et al. entitled "In-situ thin films by MOCVD," Superconducting Industry, Vol. 3, No. 1, Spring, 1990.

The high Tc superconductors currently available are ceramic materials. It is known that ceramic materials may be fabricated into film by evaporation or by sputtering methods; however, both of these methods are usually conducted under vacuum. See, e.g., B. Oh et al., "Critical current densities and transport in superconducting YBaCuO films made by electron beam coevaporation," Applied Physics Letters 51, 852 (1987); M. Hong et al., "Superconducting Y-Ba-Cu-O oxide films by sputtering," Applied Physics Letters 51, 694 (1987); D. Dijkkamp et al., "Preparation of Y-Ba-Cu oxide superconductor thin films using pulsed laser evaporation from high Tc bulk material," Applied Physics Letters 51, 619 (1987); and S. Witanachchi et al., "Deposition of superconducting Y-Ba-Cu-O films at 400 degrees centigrade without postannealing," Applied Physics Letters 53, 234 (1988).

The aforementioned prior art techniques for making films consisting of superconductive material all require the use of a reduced pressure environment during the vapor deposition step; in general, a vacuum of from $10^{-3}$ to $10^{-9}$ Torr is required. Such processes are not suitable for large scale production of the superconductive films. A substantial amount of energy, time, and money is required for a vacuum system and its operation; and such a system is not always suitable for large scale production. In addition, the size of the superconductive film which can be made by the vacuum deposition processes is limited by the size of the vacuum chamber used.

It is known that superconductive films with thicknesses in excess of 100 microns may be prepared by a tape-casting process in which vacuum is not required. See, e.g., M. Ishii et al., "Fabrication of superconducting YBaCuO films by a tape casting method," Japanese Applied Physics 26, L1959 (1987). However, this tape casting process does not routinely produce superconductive films with good adhesion properties and adequate film orientations.

It is also known that superconductive films may be prepared by a process involving plasma spraying of powders onto a surface through a high-temperature gas plasma; in this process, vacuum might not be required. See, for example, the article by M. Sayer et al. entitled "Ceramic Thin Films: Fabrication and Applications," Science, Volume 247, Mar. 2, 1990, pages 1056 to 1060.

However, this powder process generally produces films which contain a substantial amount of inhomogeneity; see, e.g., J. J. Cuomo et al., "Large area plasma spray deposited superconducting YBaCuO thick films," Advanced Ceramic Materials 2, 442 (1987) and W. T. Elam et al., "Plasma Sprayed High Tc Superconductors," Advanced Ceramic Materials, Volume 2, 411 (1987). Furthermore, due to the inhomogeneity produced by the process, the films may not be superconductive. See a paper by T. K. Vethanayagam et al., "Atmospheric Plasma Vapor Deposition of Ba-Y-Cu-Oxide and Bi-Sr-Ca-Cu-Oxide Thin Films," Proceedings of the National Thermal Spray Conference, October, 1988, Cincinnati, Ohio.

Attempts have been made to overcome the problems associated with the powder plasma technique by preparing films by a mist microwave plasma method under vacuum. Such a process is disclosed by A. Koukitu et al., Japanese Journal of Applied Physics, Volume 28, Number 7, July, 1989, pages L1212-L1213. In the Koukitu process, an aqueous solution of yttrium nitrate, barium nitrate, and copper nitrate was misted by an ultrasonic generator, the mist was injected into a quartz reactor where it was subjected to microwave radiation at a frequency of 2.45 Gigaherz, and plasma thus formed from such mist was deposited onto a substrate in the quartz reactor. The deposition step was conducted under a vacuum of 50 Torr.

The Koukitu process is not suitable for large scale production of superconductive films. In the first place, it requires the use of reduced pressure during the deposition step, with all of the disadvantages associated therewith discussed above. In the second place, the deposition must take place in a quartz reactor, thereby limiting the size of the film which may be obtained. In the third place, the Koukitu process requires microwave energy, which often is more expensive and difficult to furnish than other forms of energy, such as radio frequency energy. In the fourth place, the Koukitu process proceeds very slowly; it is disclosed that the growth rate of the films produced by the process is about 0.15 microns per hour.

Koukitu et al. did not specifically describe the dimensions of the deposition chamber they used. However, the Koukitu et al. paper did disclose that their deposition system was ". . . similar to that of the microwave plasma CVD system which is commonly used for the preparation of diamond films . . . ," and it cited a paper by M. Kamo et al., "Diamond Synthesis from Gas Phase in Microwave Plasma," Journal of Crystal Growth 62 (1983), pages 642-644 (see page L1212 of Koukitu et al.). The Kamo et al. reference discloses a deposition apparatus comprised of a ". . . silica glass tube 40 mm in diameter . . . ."

Thus, with the deposition apparatus of both Koukitu et al. and Kamo et al., the maximum area of a substrate which may be contained by the deposition chamber is about 12.6 square centimeters.

The deposition process of Koukitu et al. is substantially slower than the laser deposition process described in the aforementioned S. Witanachchi et al. paper; the latter process forms superconducting films on a substrate with a surface area of 2 square centimeters at a rate of at least about 1 microns per hour.

The Koukitu paper does not disclose either the morphological surface properties of the films produced by its process or their color.

It is an object of this invention to provide a process for producing superconductive films or coatings that will produce such materials at a rate of at least 1 micron per minute on a substrate with a surface area of at least about 30 square centimeters.

It is another object of this invention to provide a process for producing superconductive films or coatings that is able to readily produce such materials in large sizes and/or complicated shapes.

It is yet another object of this invention to provide a process for producing superconductive films or coatings that are substantially homogeneous.

It is yet another object of this invention to provide a process for the production of superconductive films or coatings that may be conducted under atmospheric pressure.

It is yet another object of this invention to provide a process for the production of superconductive films or coatings which is relatively economical and flexible.

It is yet another object of this invention to provide a process for producing superconductive films or coatings which contain a large number of relatively small grains.

It is another object of this invention to provide a process for coating a moving object with superconductive material which coats the object as it is being formed.

SUMMARY OF THE INVENTION

In accordance with this invention, there is provided an atmospheric process for the production of a superconductive coating or film. In the first step of this process, an aerosol mist containing reactants necessary to form the superconductor is provided. Thereafter, the mist is subjected to radio-frequency radiation while in the plasma region. Thereafter, the vaporized mixture is then deposited onto a substrate.

BRIEF DESCRIPTION OF THE DRAWING

The present invention will be more fully understood by reference to the following detailed description thereof, when read in conjunction with the attached drawing, wherein like reference numerals refer to like elements, and wherein.

DESCRIPTION OF THE PREFERRED EMBODIMENTS

Figure 1:
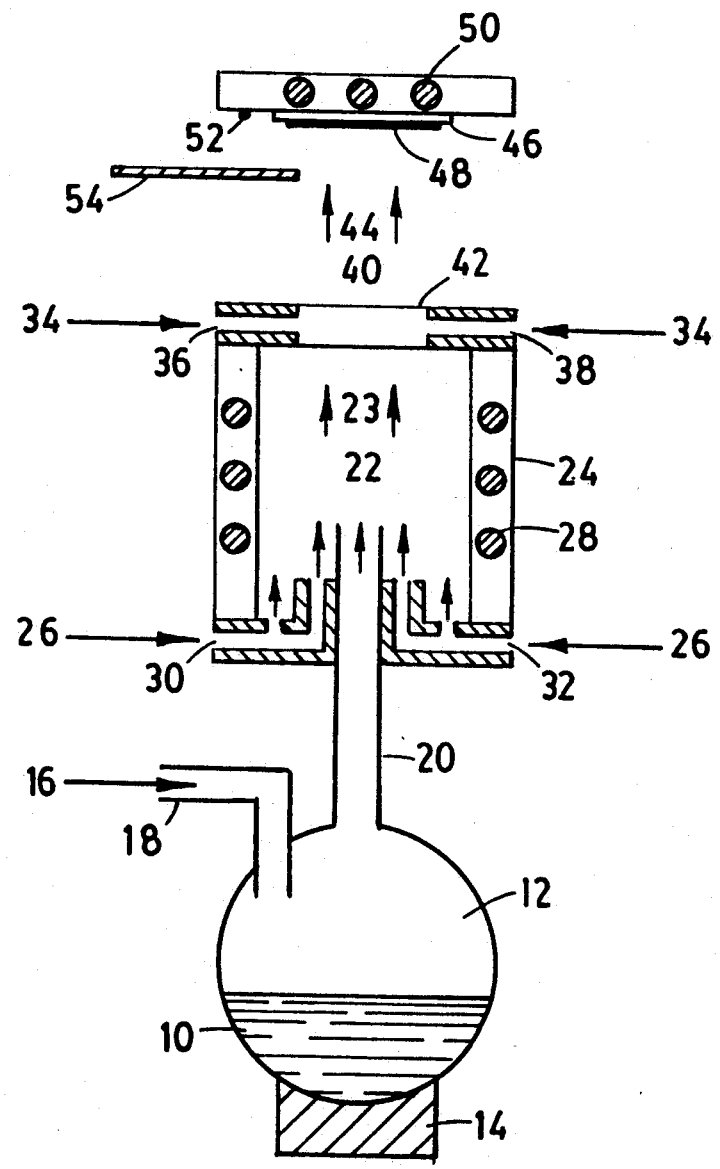
FIG. 1 is a system diagram illustrating one preferred embodiment of the process of this invention.

FIG. 1 illustrates a preferred embodiment of applicants' process. In the first step of the process, a solution 10 of reagents is charged into misting chamber 12.

The solution 10 will contain reagents necessary to produce a High Tc ceramic superconductor. These superconductors, and the reagents needed to produce them, are well known to those skilled in the art. Thus, these superconductors are described in an article by A. W. Sleight entitled "Chemistry of High-Temperature Superconductors," Science, Volume 242 (Dec. 16, 1988, at pages 1519-1527), the disclosure of which is hereby incorporated by reference into this specification.

One preferred class of superconductors, described on pages 1522-1523 of the Sleight article, is of the formula $R\ Ba_2\ Cu_3\ O_{6+x}$, wherein x is from about 0.5 to about 1.0 and R is a rare earth element selected from the group consisting of yttrium, gadolinium, lanthanum, europium, holmnium, and the like. In one preferred embodiment, R is yttrium.

Another preferred class of superconducting materials is of the formula $(AO)_m\ M_2\ Ca_{n-1}\ Cu_n\ O_{2n+2}$, wherein A is selected from the group consisting of thallium, bismuth, and mixtures of bismuth and lead, m is from about 1 to about 2 (and generally is 1 or 2 when A is thallium and is 2 when A is bismuth), M is selected from the group consisting of barium and strontium, and n is at least 1. In one preferred embodiment, illustrated on page 1523 of the Sleight article, A is thallium, m is 2, M is barium, and n is 3; this composition has a critical temperature of about 122 degrees Kelvin.

In one embodiment, the starting materials are powders with purities exceeding 99 percent.

In one embodiment, compounds of yttrium, barium, and copper are present in the solution in the stoichiometric ratio of yttrium:barium:copper of 1:2:3. In this embodiment, it is preferred to use water-soluble salts such as, for example, the nitrates or chlorides of these metals. Alternatively, one may use salts soluble in solvents other than water. Some of these other solvents which may be used to prepare the 1:2:3 material, and/or the other superconductive materials described below, include nitric acid, hydrochloric acid, phosphoric acid, sulfuric acid, and the like. As is well known to those skilled in the art, many other suitable solvents may be used; see, e.g., J. A. Riddick et al., "Organic Solvents, Techniques of Chemistry," Volume II, 3rd edition (Wiley-Interscience, New York, N.Y., 1970), the disclosure of which is hereby incorporated by reference into this specification.

In another embodiment, compounds (such as salts) of bismuth, calcium, strontium, and copper are present in the solution in the stoichiometric ratio of 4:3:3:4. In another embodiment, compounds (such as salts) of bismuth, calcium, strontium, and copper are present in the solution in the stoichiometric ratio of 2:1:2:2. In another embodiment, compounds (such as salts) of bismuth, calcium, strontium, and copper are present in the solution in the stoichiometric ratio of 2:2:2:3. In these embodiments, it is preferred to use the water-soluble compounds (such as salts) of these metals such as, e.g., the nitrates or chlorides of bismuth, calcium, strontium, and copper. However, one may also use salts or other compunds which are not soluble in water.

In another embodiment, compounds (such as salts) of thallium, calcium, barium or strontium, and copper are present in the solution in the stoichiometric ratio of 2:2:2:3. In another embodiment, compounds (such as salts) of thallium, calcium, barium or strontium, and copper are present in the solution in the stoichiometric ratio of 2:1:2:2. In these embodiments, it is preferred to use the water-soluble salts of these metals such as, e.g., the nitrates or chlorides of bismuth, calcium, strontium, and copper. However, one may also use salts or other compounds which are not soluble in water but, preferably, are soluble in one or more other solvents.

In another embodiment, one or more of the aforementioned reagents may be used in oxide form rather than in the form of their salts. In this embodiment, the solvent used is generally one which will form a solution with the oxide(s) such as, for example, inorganic acids such as, e.g., nitric acid, hydrochloric acid, phosphoric acid, sulfuric acid, and the like.

In general, one may use commercially available reagent grade materials. Thus, by way of illustration and not limitation, one may use the following reagents available in the 1988-1989 Aldrich catalog (Aldrich Chemical Company, Inc., Milwaukee, Wis.): barium chloride, catalog number 31,866-3; barium nitrate, catalog number 32,806-5; barium sulfate, catalog number 20,276-2; bismuth chloride, catalog number 25,414-2; bismuth nitrate pentahydrate, catalog number 25,415-0; calcium chloride hydrate, catalog number 20,294-0; calcium nitrate hydrate, 20,296.7; calcium sulfate, catalog number 25,569-6; copper chloride dihydrate, 30,748-3; copper nitrate hydrate, 22,963-6; copper sulfate pentahydrate, catalog number 20,316-5; strontium chloride hexhydrate, catalog number 20,466-3; strontium nitrate, catalog number 20,449-8; yttrium chloride, catalog number 29,826-3; yttrium nitrate tetrahydrate, catalog number 21,723-9; yttrium sulfate octahydrate, catalog number 20,493-5. This list is merely illustrative, and other compounds which can be used will be readily apparent to those skilled in the art. Thus, any of the desired reagents also may be obtained from the 1989-1990 AESAR catalog (Johnson Matthey/AESAR Group, Seabrook, N.H.), the 1990/1991 Alfa catalog (Johnson Matthey/Alfa Products, Ward Hill, Mass.), the Fisher 88 catalog (Fisher Scientific, Pittsburgh, Pa.), and the like.

As long as the metals present in the desired superconductive material are present in solution 10 in the desired stoichiometry, it does not matter whether they are present in the form of a salt, an oxide, or in another form. In one embodiment, however, it is preferred to have the solution contain either the salts of such metals, or their oxides.

The solution 10 of the compounds of such metals preferably will be at a concentration of from about 0.01 to about 1,000 grams of said reagent compounds per liter of the resultant solution. As used in this specification, the term liter refers to 1,000 cubic centimeters.

In one embodiment, it is preferred that solution 10 have a concentration of from about 1 to about 300 grams per liter and, preferably, from about 25 to about 170 grams per liter. It is even more preferred that the concentration of said solution 10 be from about 100 to about 160 grams per liter. In an even more preferred embodiment, the concentration of said solution 10 is from about 140 to about 160 grams per liter.

In one preferred embodiment, aqueous solutions of yttrium nitrate, barium nitrate, and copper nitrate with purities of at least 99.9 percent are mixed in the molar ratio of 1:2:3 and then dissolved in distilled water to form a solution with a concentration of 150 grams per liter.

Referring again to FIG. 1, the solution 10 in misting chamber 12 is preferably caused to form into an aerosol, such as a mist.

The term aerosol, as used in this specification, refers to a suspension of ultramicroscopic solid or liquid particles in air or gas, such as smoke, fog, or mist. See, e.g., page 15 of "A dictionary of mining, mineral, and related terms," edited by Paul W. Thrush (U.S. Department of the Interior, Bureau of Mines, 1968), the disclosure of which is hereby incorporated by reference into this specification. In general, the aerosol particles have diameters of from about 0.1 to about 100 microns and, preferably, less than about 10 microns.

As used in this specification, the term mist refers to gas-suspended liquid particles which have diameters less than 10 microns.

The aerosol/mist consisting of gas-suspended liquid particles with diameters less than 10 microns may be produced from solution 10 by any conventional means which causes sufficient mechanical disturbance of said solution. Thus, one may use mechanical vibration. In one preferred embodiment, ultrasonic means are used to mist solution 10.

As is known to those skilled in the art, ultrasonic sound waves (those having frequencies above 20,000 hertz) may be used to mechanically disturb solutions and cause them to mist. Thus, by way of illustration, one may use the ultrasonic nebulizer sold by the DeVilbiss Health Care, Inc. of Somerset, Pa.; see, e.g., the Instruction Manual for the "Ultra-Neb 99 Ultrasonic Nebulizer," publication A-850-C (published by DeVilbiss, Somerset, Pa., 1989), the disclosure of which is hereby incorporated by reference into this specification.

In the embodiment shown in FIG. 1, the oscillators of ultrasonic nebulizer 14 are shown contacting an exterior surface of misting chamber 12. In this embodiment, the ultrasonic waves produced by the oscillators are transmitted via the walls of the misting chamber 12 and effect the misting of solution 10.

In another embodiment, not shown, the oscillators of ultrasonic nebulizer 14 are in direct contact with solution 10.

It is preferred that the ultrasonic power used with such machine should be in excess of one watt and, more preferably, in excess of 10 watts. In one embodiment, the power used with such machine exceeds about 50 watts.

During the time solution 10 is being caused to mist, it is preferably contacted with carrier gas to apply pressure to the solution and mist. It is preferred that a sufficient amount of carrier gas is introduced into the system at a sufficiently high flow rate so that pressure on the system is in excess of atmospheric pressure. Thus, for example, in one embodiment wherein chamber 12 has a volume of about 200 cubic centimeters, the flow rate of the carrier gas was from about 100 to about 150 milliliters per minute.

The carrier gas 16 is introduced via feeding line 18 at a rate sufficient to cause solution 10 to mist at a rate of from about 0.5 to about 20 milliliters per minute. In one embodiment, the misting rate of solution 10 was from about 1.0 to about 3.0 milliliters per minute.

Substantially any gas which facilitates the formation of plasma may be used as carrier gas 16. Thus, by way of illustration, one may use oxygen, air, argon, nitrogen, and the like. It is preferred that the carrier gas used be a compressed gas under a pressure in excess 760 millimeters of mercury. In this embodiment, the use of the compressed gas facilitates the movement of the mist from the misting chamber 12 to the plasma region 22.

The misting container 12 may be any reaction chamber conventionally used by those skilled in the art and should preferably be constructed out of such acid-resistant materials such as glass, plastic, and the like.

The mist from misting chamber 12 is fed via misting outlet line 20 into the plasma region 22 of plasma reactor 24. In plasma reactor 24, the mist is mixed with plasma generated by plasma gas 26 and subjected to radio frequency radiation provided by a radio-frequency coil 28.

The plasma reactor 24 provides energy to form plasma and to cause the plasma to react with the mist. Any of the plasmas reactors well known to those skilled in the art may be used as plasma reactor 24. Some of these plasma reactors are described in J. Mort et al., "Plasma Deposited Thin Films" (CRC Press Inc., Boca Raton, Fla., 1986); "Methods of Experimental Physics," Volume 9—Parts A and B, Plasma Physics (Academic Press, New York, 1970/1971); N. H. Burlingame, "Glow Discharge Nitriding of Oxides," Ph.D. thesis (Alfred University, Alfred, N.Y., 1985), available from University Microfilm International, Ann Arbor, Mich. Each of these publications is hereby incorporated by reference into this specification.

In one preferred embodiment, the plasma reactor 24 was "model 56 torch" available from the TAFA Inc. of Concord, N.H. It was operated at a frequency of about 4 megahertz and an input power of 30 kilowatts.

Into feeding lines 30 and 32 is fed plasma gas 26. As is known to those skilled in the art, a plasma can be produced by passing gas into a plasma reactor. A discussion of the formation of plasma is contained in B. Chapman's "Glow Discharge Processes" (John Wiley & Sons, New York, 1980), the disclosure of which is hereby incorporated by reference into this specification.

In one preferred embodiment, the plasma gas used is a mixture of argon and oxygen. In another embodiment, the plasma gas is a mixture of nitrogen and oxygen. In yet another embodiment, the plasma gas is pure argon or pure nitrogen.

When the plasma gas is pure argon or pure nitrogen, it is preferred to introduce into the plasma reactor at a flow rate of from about 5 to about 30 liters per minute.

When a mixture of oxygen and either argon or nitrogen is used, the concentration of oxygen in the mixture should preferably be from about 1 to about 40 volume percent and, preferably, from about 15 to about 25 volume percent. When such a mixture is used, the flow rates of each gas in the mixture should be adjusted to obtain the desired gas concentrations. Thus, by way of illustration, in one embodiment which uses a mixture of argon and oxygen, the argon flow rate was 15 liters per minute, and the oxygen flow rate was 40 liters per minute.

In one embodiment, auxiliary oxygen 34 is fed into the top of reactor 24, between the plasma region 22 and the flame region 40, via lines 36 and 38. In this embodiment, the auxiliary oxygen is not involved in the formation of plasma but is involved in the enhancement of the oxidation of the oxide superconductive material.

Radio frequency energy is applied to the reagents in the plasma reactor 24, and it causes vaporization of the mist. In general, the energy is applied at a frequency of from about 100 to about 30,000 kilohertz. In one embodiment, the radio frequency used is from about 1 to 20 megahertz. In another embodiment, the radio frequency used is from about 3 to about 5 megahertz.

As is known to those skilled in the art, such radio frequency alternating currents may be produced by conventional radio frequency generators. Thus, by way of illustration, said TAPA Inc. "model 56 torch" is attached to a radio frequency generator rated for operation at 35 kilowatts which manufactured by Lepel Company (a division of TAFA Inc.) and which generates an alternating current with a frequency of 4 megaherz at a power input of 30 kilowatts. Thus, e.g., one may use an induction coil driven at 2.5–5.0 megahertz which is sold as the "PLASMOC 2" by ENI Power Systems, Inc. of Rochester, N.Y.

The use of these type of radio-frequency generators is described in the Ph.D. theses entitled (1) "Heat Transfer Mechanisms in High-Temperature Plasma Processing of Glasses," Donald M. McPherson (Alfred University, Alfred, N.Y., January, 1988) and (2) the aforementioned Nicholas H. Burlingame's "Glow Discharge Nitriding of Oxides." The disclosure of each of these publications is hereby incorporated by reference into this specification.

The plasma vapor 23 formed in plasma reactor 24 is allowed to exit via the aperture 42 and can be visualized in the flame region 40. In this region, the plasma contacts air which is at a lower temperature than the plasma region 22, and a flame is visible. A theoretical model of the plasma/flame is presented on pages 88 et seq. of said McPherson thesis.

The vapor 44 present in flame region 40 is propelled upward towards substrate 46. Any material onto which vapor 44 will condense may be used as a substrate.

In one preferred embodiment, substrate 46 consists essentially of a magnesium oxide material such as single crystal magnesium oxide, polycrystalline magnesium oxide, and the like.

In another embodiment, the substrate 46 consists essentially of zirconia such as, e.g., yttrium stabilized cubic zirconia.

In another embodiment, the substrate 46 consists essentially of a material selected from the group consisting of strontium titanate, nickel foil, stainless steel, alumina, sapphire, and the like.

The aforementioned listing of substrates is merely meant to be illustrative, and it will be apparent that many other substrates may be used. Thus, by way of illustration, one may use any of the substrates mentioned in M. Sayer's "Ceramic Thin Films ... " article, supra. Thus, for example, it is preferred to use one or more of the substrates described on page 286 of "Superconducting Devices," edited by S. T. Ruggiero et al. (Academic Press, Inc., Boston, 1990), the disclosure of which is hereby incorporated by reference into this specification.

One advantage of applicants' process is that the substrate may be of substantially any size or shape, and it may be stationary or movable. Because of the speed of the coating process, the substrate 46 may be moved across the aperture 42 and have any or all of its surface be coated with the superconductive film 48.

The substrate may be at ambient temperature. Alternatively, one may use additional heating means to heat the substrate prior to, during, or after deposition of the coating.

In one preferred embodiment, heater 50 is used to heat the substrate to a temperature of from about 400 to about 800 degrees centigrade. In another preferred embodiment, the substrate is heated to a temperature of from about 550 to about 650 degrees centigrade.

Temperature sensing means 52 may be used to sense the temperature of the substrate and, by feedback means (not shown) adjust the output of heater 50. In one embodiment, not shown, when the substrate 46 is relatively near flame region 40, then optical pyrometry measurement means (not shown) may be used to measure the temperature near the substrate.

In one embodiment, illustrated in FIG. 1, a shutter 54 is used to selectively interrupt the flow of vapor 44 to substrate 46. The use of this shutter 54 is important prior to the time the flame region has become stable; and the vapor should not be allowed to impinge upon the substrate prior to such time.

The substrate 46 may be moved in a plane which is substantially parallel to the top of plasma chamber 24. Alternatively, or additionally, it may be moved in a plane which is substantially perpendicular to the top of plasma chamber 24. In one embodiment, the substrate 46 is moved stepwise along a predetermined path to coat the substrate only at certain predetermined areas.

In one embodiment, rotary substrate motion is utilized to expose as much of the surface of a complex-shaped article to the coating. This rotary substrate motion may be effected by conventional means. See, e.g., "Physical Vapor Deposition," edited by Russel J. Hill (Temescal Division of The BOC Group, Inc., Berkeley, Calif., 1986), the disclosure of which is hereby incorporated by reference into this specification.

The process of this invention allows one to coat an article at a deposition rate of from about 0.01 to about 10 microns per minute and, preferably, from about 0.1 to about 1.0 microns per minute, with a substrate with an exposed surface of 35 square centimeters. One may determine the thickness of the film coated upon said reference substrate material (with an exposed surface of 35 square centimeters) by means well known to those skilled in the art.

The film thickness can be monitored in situ, while the vapor is being deposited onto the substrate. Thus, by way of illustration, one may use an IC-6000 thin film thickness monitor (as referred to as "deposition controller") manufactured by Leybold Inficon Inc. of East Syracuse, N.Y.

The deposit formed on the substrate may be measured after the deposition by standard profilemetry techniques. Thus, e.g., one may use a DEKTAK Surface Profiler, model number 900051 (available from Sloan Technology Corporation, Santa Barbara, Calif.)

In general, the process of this invention may be used to deposit films which are from about 0.1 to about 500 microns and, preferably, from about 1 to about 100 microns. In a more preferred embodiment, the films deposited by the process are from about 10 to about 50 microns in thickness.

The "as-deposited" film produced by the process of this invention is consists of uniform, small grains. The term "as-deposited" refers to the film prior to the time it is subjected to post-annealing.

In general, at least about 80 volume percent of the particles in the as-deposited film are smaller than about 1 microns. It is preferred that at least about 90 percent of such particles are smaller than 1 micron. Because of this fine grain size, the surface of the film is relatively smooth.

In one embodiment, the as-deposited film is post-annealed by heating it at a temperature of from about 750 to about 900 degrees centrigrade for from about 10 to about 120 minutes while flowing oxygen around it at a flow rate of from about 0.1 to about 2.0 cubic centimeters per minute.

It is preferred that the generation of the vapor in plasma rector 24 be conducted under substantially atmospheric pressure conditions. As used in this specification, the term "substantially atmospheric" refers to a pressure of at least about 600 millimeters of mercury and, preferably, from about 600 to about 1,000 millimeters of mercury. It is preferred that the vapor generation occur at about atmospheric pressure. As is well known to those skilled in the art, atmospheric pressure at sea level is 760 millimeters of mercury; see, e.g., page 60 of said "A dictionary of mining, mineral, and related terms," supra.

The process of this invention may be used to produce superconductive coatings on a flexible substrate such as, e.g., stainless steel strips, nickel strips, silver strips, gold strips, copper strips, aluminum strips, and the like. One may deposit the coating directly onto such a metallic strip. Alternatively, one may first deposit one or more buffer layers onto the strip(s).

The deposition of buffer layers between a substrate and a superconductive coating is well known to those skilled in the art. See, e.g., (1) H. S. Kwok et al., "Laser evaporation deposition of superconducting and dielectric thin films," Applied Physics Letters, Volume 52 (21), May 23, 1988; (2) S. Witanachchi et al., "Laser Deposition of Superconducting and Semiconducting Thin Films," in "Superconductivity and its Applications," edited by H. S. Kwok et al. (Elsevier Company, New York, 1988), at pages 194 et seq. The disclosure of each of these publications is hereby incorporated by reference into this specification.

The following examples are presented to illustrate the claimed invention but are not to be deemed limitative thereof. Unless otherwise specified, all parts are by weight and all temperatures are in degrees centigrade.

EXAMPLE 1

5.9705 grams of yttrium nitrate hexahydrate (catalog number 12898, 1990–1991 Alfa catalog), 8.1497 grams of barium nitrate (catalog number 32,806-5, Aldrich Chemical), and 10.8798 grams of copper (II) nitrate hemipentahydrate (catalog number 22,339-5, Aldrich Chemical) were mixed with 100 milliliters of distilled water to form an aqueous solution with a concentration of 250 grams per liter. The solution was then poured into a hemispherical plastic mist chamber with a capacity of 200 cubic centimeters which was equipped with a gas inlet and a mist outlet.

The mist chamber containing the solution was placed onto the aforementioned DeVilbiss ultrasonic nebulizer generator described in the specification; the ultrasonic generator was operated at a power of 70 watts and a frequency of 1.63 megahertz; the misting droplets formed were from about 0.5 to about 5.0 microns diameter in size. The gas inlet of the chamber was connected to a source of oxygen flowing at a rate of 130 milliliters per minute; the mist rate of the solution exiting the chamber was 2 milliliters per minute.

The output from the misting chamber was connected to the TAFA plasma reactor equipped with the Lepel radio frequency generator, both of which are described in the specification. The Lepel radio frequency generator was operated at a power of 30 kilowatts and produced an alternating current of 4 megahertz. A mixture of oxygen and argon was introduced into the bottom portion of the plasma reactor; the oxygen flow rate was 40 liters per minute, and the argon flow rate was 15 liters per minute. An auxiliary source of oxygen was flowed into the top of the plasma reactor at a flow rate of 5 liters per minute. The distance between the top of the plasma reactor and the substrate was 10 centimeters.

The vapor from the plasma reactor deposited onto a polycrystalline magnesium oxide article which was 1.0 centimeter by 1.0 centimeter by 0.5 centimeters and which had been heated to a substrate temperature of 600 degrees centigrade. The deposition rate was 1 micron per minute, on an area of 35 square centimeters. A coated object with a film thickness of 25 microns was obtained. The color of the as-deposited film was dark black.

The film so deposited was subjected to X-ray diffraction analysis on a Siemens D-500 Diffractometer (model number C72298-A223-B-9-POZ-228, manufactured by the Siemens Company of West Germany) using copper K-alpha radiation and a diffracted beam graphite monochrometer. Analysis revealed that the dominant phase in the coating was yttrium-barium-copper 1-2-3 phase.

The film so deposited was subjected to Scanning Electron Microscopic (SEM) analysis. It was found that the grain sizes in the film were smaller than 1.0 cubic micron.

The film was annealed by at a temperature of 840 degrees centigrade for 2 hours while under flowing oxygen (1 cubic centimeter per minute). The superconducting properties of the annealed film were then evaluated in accordance with the procedure described in a paper by M. Pistakis and X. W. Wang, "Automated Superconductor Measurements System," The Review of Scientific Instrumentation, 60(1), pages 135-136, 1989, the disclosure of which is hereby incorporated by reference into this specification; a Keithly current source providing about 1 microampere to the sample (model number 228A, Keithly Instrument Inc., Cleveland, Ohio) was used. A Keithly multimeter (model 195) was used as a voltmeter to measure the voltage drop across the superconducting sample due to the current. The resistance of the sample at a given temperature is equal to the voltage divided by the current. Another Keithly multimeter (model 196) was used as voltmeter for the thermocouple. The onset temperature of the superconducting transition was 97 degrees Kelvin, the transition width (10%-90%) was 10 degrees Kelvin, and the zero resistance temperature was 70 degrees Kelvin. X-ray diffraction analysis revealed that the superconducting film was a phase pure 1:2:3 material. Scanning Electron Microscopy analysis revealed that the grain sizes in the post-annealed film were smaller than 4 microns by 1 micron by 1 micron and that the grain distribution in the film was homogeneous.

EXAMPLE 2

The procedure of example 1 was substantially repeated with the exception that the substrate was single-crystal yttrium-stabilized cubic zirconia. The onset temperature of the superconducting transition was 90 degrees Kelvin, the transition width (10%-90%) was 10 degrees Kelvin, and the zero resistance temperature was 73 degrees Kelvin.

EXAMPLE 3

The procedure of example 1 was substantially repeated with the exception that the substrate was nickel foil which was about 0.1 centimeters thick. The onset temperature of the superconducting transition was 85 degrees Kelvin, the transition width (10%-90%) was 19 degrees Kelvin, and the zero resistance temperature was 46 degrees Kelvin.

EXAMPLE 4

The procedure of Example 1 was substantially followed with the exception 3.7824 grams of yttrium oxide, 13.2227 grams of barium carbonate, and 7.9949 grams of copper (II) oxide were mixed with 100 milliliters of 0.2 normal hydrochloric acid and 1000 milliliters of distilled water and charged to the misting chamber; the solution thus obtained has a density of 25 grams per liter.

EXAMPLE 5

The procedure of Example 1 was substantially followed with the exception 1.8912 grams of yttrium oxide, 6.6114 grams of barium carbonate, and 3.9974 grams of copper (II) oxide were mixed with 25 milliliters of 0.1 normal hydrochloric acid and 100 milliliters of distilled water and charged to the misting chamber; the solution thus obtained had a density of 125 grams per liter.

EXAMPLE 6

The procedure of Example 1 was substantially followed, with the exception that 4.3684 grams of bismuth nitrate pentahydrate, 1.9059 grams of strontium nitrate, 1.0633 grams of calcium nitrate tetrahydrate, and 2.6624 grams of copper nitrate hexahydrate were mixed with 200 milliliters of deionized water and charged to the mixing chamber; the solution thus produced has a density of 50 grams per liter.

Scanning Electron Microscopic (SEM) analysis revealed that the film produced is very similar to the bismuth-calcium-strontium-copper superconducting 2-1-2-2 phase.

It is to be understood that the aforementioned description is illustrative only and that changes can be made in the apparatus, the ingredients and their proportions, and in the sequence of combinations and process steps as well as in other aspects of the invention discussed herein without departing from the scope of the invention as defined in the following claims.

Thus, for example, referring to FIG. 1, plasma reactor 24 may be tilted, reversed, or otherwise differently disposed than shown in said Figure without adversely affecting applicants' process.

We claim:

1. A process for coating a layer of oxide super-conductive material containing large amount of small grains, with a thickness of from about 0.1 to about 500 microns onto a substrate at a deposition rate of from about 0.01 to about 10 microns per minute per 35 square centimeters of substrate surface, comprising the steps of:

(a) providing a solution comprised of an yttrium compound, a barium compound, and a copper compound, wherein said yttrium, said barium, and said copper are present in said solution in the stoichiometric ratio of 1:2:3, and wherein said solution is comprised of from about 0.01 to about 1,000 grams of a mixture consisting esentially of said yttrium compound, said barium compound, and said copper compound per liter of said solution;

(b) subjecting said solution to ultrasonic sound waves at a frequency in excess of 20,000 hertz, and to a substantially atmospheric pressure of from about 600 to about 1,000 millimeters of mercury, thereby causing said solution to form into an aerosol;

(c) providing a radio frequency plasma reactor comprised of a top section, a bottom section, a radio-frequency coil, and inlet means for feeding oxygen into said top section of said reactor;

(d) generating a hot plasma within said radio frequency reactor, thereby producing a plasma region;

(e) providing a flame region disposed above said top of said radio frequency plasma reactor;

(f) contacting said aerosol with said hot plasma gas within said plasma reactor while subjecting said aerosol to a substantially atmospheric pressure of from about 600 to about 1,000 millimeters of mercury and to a radio frequency alternating current at a frequency of from about 100 kilohertz to about 30 megahertz, thereby forming a vapor;

(g) feeding oxygen into said top section of said radio-frequency plasma reactor between said plasma region and said flame region;

(h) providing a substrate disposed above said flame region; and (i) contacting said vapor with said substrate, thereby forming said layer.

2. The process as recited in claim 1, wherein said deposition rate is from about 0.1 to about 1.0 microns per minute per 35 square centimeters of substrate surface.

3. The process as recited in claim 2, wherein said aerosol is subjected while within said plasma reactor to a radio frequency alternating current of from about 1 to about 20 megahertz.

4. The process as recited in claim 3, wherein said solution is subjected to ultrasonic sound waves at a frequency in excess of one megahertz.

5. The process as recited in claim 4, wherein said solution is comprised of from about 1 to about 300 grams of said mixture consisting essentially of said yttrium compound, said barium compound, and said copper compound, per liter of said solution.

6. A process for coating a layer of oxide superconductive material containing large amount of small grains, with a thickness of from about 0.1 to about 500 microns onto a substrate at a deposition rate of from about 0.01 to about 10 microns per minute per 35 square centimeters of substrate surface, comprising the steps of:

(a) providing a solution comprised of a bismuth compound, a calcium compound, a strontium compound, and a copper compound, wherein said bismuth, said calcium, said strontium, and said copper are present in said solution in the stoichiometric ratio of 2:1:2:2, and wherein said solution is comprised of from about 0.01 to about 1,000 grams of a mixture consisting essentially of said bismuth compound, said calcium compound, said strontium compound, and said copper compound per liter of said solution;

(b) subjecting said solution to ultrasonic sound waves at a frequency in excess of 20,000 hertz, and to a substantially atmospheric pressure of from about 600 to about 1,000 millimeters of mercury, thereby causing said solution to form into an aerosol;

(c) providing a radio frequency plasma reactor comprised of a top section, a bottom section, a radio-frequency coil, and inlet means for feeding oxygen into said top section of said reactor;

(d) generating a hot plasma within said radio frequency reactor, thereby producing a plasma region;

(e) providing a flame region disposed above said top of said radio frequency plasma reactor;

(f) contacting said aerosol with said hot plasma gas within said plasma reactor while subjecting said aerosol to a substantially atmospheric pressure of from about 600 to about 1,000 millimeters of mercury and to a radio frequency alternating current at a frequency of from about 100 kilohertz to about 30 megahertz, thereby forming a vapor;

(g) feeding oxygen into said top section of said radio-frequency plasma reactor between said plasma region and said flame region;

(h) providing a substrate disposed above said flame region; and (i) contacting said vapor with said substrate, thereby forming said layer.

7. The process as recited in claim 6, wherein said deposition rate is from about 0.1 to about 1.0 microns per minute per 35 square centimeters of substrate surface.

8. The process as recited in claim 7, wherein said aerosol is subjected while within said plasma reactor to a radio frequency alternating current of from about 1 to about 20 megahertz.

9. The process as recited in claim 8, wherein said solution is subjected to ultrasonic sound waves at a frequency in excess of one megahertz.

10. The process as recited in claim 9, wherein said solution is comprised of from about 1 to about 300 grams of said mixture consisting essentially of said bismuth compound, said calcium compound, said strontium compound, and said copper compound, per liter of said solution.

11. A process for coating a layer of oxide superconductive material containing large amount of small grains, with a thickness of from about 0.1 to about 500 microns onto a substrate at a deposition rate of from about 0.01 to about 10 microns per minute per 35 square centimeters of substrate surface, comprising the steps of:

(a) providing a solution comprised of a bismuth compound, a calcium compound, a strontium compound, and a copper compound, wherein said bismuth, said calcium, said strontium, and said copper are present in said solution in the stoichiometric ratio of 2:2:2:3, and wherein said solution is comprised of from about 0.01 to about 1,000 grams of a mixture consisting essentially of said bismuth compound, said calcium compound, said strotium compound and said copper compound per liter of said solution;

(b) subjecting said solution to ultrasonic sound waves at a frequency in excess of 20,000 hertz, and to a substantially atmospheric pressure of from about 600 to about 1,000 millimeters of mercury, thereby causing said solution to form into an aerosol;

(c) providing a radio frequency plasma reactor comprised of a top section, a bottom section, a radio-frequency coil, and inlet means for feeding oxygen into said top section of said reactor;

(d) generating a hot plasma within said radio frequency reactor, thereby producing a plasma region;

(e) providing a flame region disposed above said top of said radio frequency plasma reactor;

(f) contacting said aerosol with said hot plasma gas within said plasma reactor while subjecting said aerosol to a substantially atmospheric pressure of from about 600 to about 1,000 millimeters of mercury and to a radio frequency alternating current at a frequency of from about 100 kilohertz to about 30 megahertz, thereby forming a vapor;

(g) feeding oxygen into said top section of said radio-frequency plasma reactor between said plasma region and said flame region;

(h) providing a substrate disposed above said flame region; and (i) contacting said vapor with said substrate, thereby forming said layer.

12. The process as recited in claim 11, wherein said deposition rate is from about 0.1 to about 1.0 microns per minute per 35 square centimeters of substrate surface.

13. The process as recited in claim 12, wherein said aerosol is subjected while within said plasma reactor to a radio frequency alternating current of from about 1 to about 20 megahertz.

14. The process as recited in claim 13, wherein said solution is subjected to ultrasonic sound waves at a frequency in excess of one megahertz.

15. The process as recited in claim 14, wherein said solution is comprised of from about 1 to about 300 grams of said mixture consisting essentially of said bismuth compound, said calcium compound, said strontium compound, and said copper compound, per liter of said solution.

16. The process as recited in claim 15, wherein said layer of superconductive material has a thickness of from about 1 to about 100 microns.

* * * * *